US008569671B2

(12) United States Patent
Meynants et al.

(10) Patent No.: US 8,569,671 B2
(45) Date of Patent: Oct. 29, 2013

(54) PIXEL ARRAY CAPABLE OF PERFORMING PIPELINED GLOBAL SHUTTER OPERATION INCLUDING A FIRST AND SECOND BUFFER AMPLIFIER

(75) Inventors: Guy Meynants, Retie (BE); Jan Bogaerts, St. Katelijne Waver (BE)

(73) Assignee: CMOSIS NV, Antwerp (BE)

( * ) Notice: Subject to any disclaimer, the term of this patent is extended or adjusted under 35 U.S.C. 154(b) by 318 days.

(21) Appl. No.: 12/408,975

(22) Filed: Mar. 23, 2009

(65) Prior Publication Data

US 2009/0256060 A1    Oct. 15, 2009

(30) Foreign Application Priority Data

Apr. 7, 2008   (GB) .................................... 0806274.7
Oct. 17, 2008  (EP) ..................................... 08166987

(51) Int. Cl.
*H01L 27/00*     (2006.01)
*H01J 40/14*     (2006.01)

(52) U.S. Cl.
USPC ................................... 250/208.1; 250/214 R

(58) Field of Classification Search
USPC .................... 250/208.1, 214 R, 214.1, 214 A;
257/414, 428, 431, 443, 444, 290–294,
257/298, 300; 348/294, 296–302, 307, 308
See application file for complete search history.

(56) References Cited

U.S. PATENT DOCUMENTS

| 4,914,518 | A | * | 4/1990 | Suga | 348/296 |
|---|---|---|---|---|---|
| 5,268,576 | A | * | 12/1993 | Dudley | 250/332 |
| 5,461,491 | A | * | 10/1995 | Degi | 358/482 |
| 6,040,568 | A | * | 3/2000 | Caulfield et al. | 250/208.1 |
| 6,317,154 | B2 | * | 11/2001 | Beiley | 348/308 |
| 6,847,070 | B2 | | 1/2005 | Fox | |
| 6,847,400 | B2 | * | 1/2005 | Hosier et al. | 348/313 |
| 7,224,389 | B2 | | 5/2007 | Dierickx | |
| 7,286,174 | B1 | * | 10/2007 | Weale et al. | 348/308 |
| 2002/0134913 | A1 | * | 9/2002 | Hosier et al. | 250/208.1 |
| 2006/0192864 | A1 | * | 8/2006 | Mauritzson | 348/241 |
| 2007/0096233 | A1 | * | 5/2007 | Jeon | 257/431 |

FOREIGN PATENT DOCUMENTS

JP       2006-311008       11/2006

OTHER PUBLICATIONS

Search Report of UK-IPO regarding British Patent Application No. GB 0806274.7, Jul. 22, 2008.

(Continued)

*Primary Examiner* — Pascal M Bui Pho
(74) *Attorney, Agent, or Firm* — Bacon & Thomas, PLLC

(57) ABSTRACT

A pixel comprises a photo-sensitive element for generating charges in response to incident radiation and a sense node. A transfer gate is positioned between the photo-sensitive element and the sense node for controlling transfer of charges to the sense node. A reset switch is connected to the sense node for resetting the sense node to a predetermined voltage. A first buffer amplifier has an input connected to the sense node. A sample stage is connected to the output of the first buffer amplifier and is operable to sample a value of the sense node. A second buffer amplifier has an input connected to the sample stage. Control circuitry operates the reset switch and causes the sample stage to sample the sense node while the photo-sensitive element is being exposed to radiation. An array of pixels is synchronously exposed to radiation. Sampled values for a first exposure period can be read while the photo-sensitive element is exposed for a second exposure period.

13 Claims, 14 Drawing Sheets

(56) References Cited

OTHER PUBLICATIONS

"A New Correlated Double Sampling (CDS) Technique for Low Voltage Design Environment in Advanced CMOS Technology", Xu et al., Proceedings of the 28$^{th}$ European Solid-State Circuit Conference (ESSCIRC 2002), pp. 117-120, Sep. 24-26, 2002, Firenze, Italy.

"A 600×600 pixel, 500 fps CMOS Image Sensor with a 4.4 μm Pinned Photodiode 5-Transistor Global Shutter Pixel", I. Takayanagi, et al., proc. International Workshop on Image Sensors, Main, Jun. 2007, p. 287.

Official Communication Dated Feb. 26, 2013 Related to Application No. 09155902.1-1905.

OA dated Jul. 3, 2013 cited in copending U.S. Appl. No. 13/344,095.

* cited by examiner

PIXEL ARRAY CAPABLE OF PERFORMING PIPELINED GLOBAL SHUTTER OPERATION INCLUDING A FIRST AND SECOND BUFFER AMPLIFIER

FIELD OF THE INVENTION

This invention relates to a pixel, and to an array of pixels, for use in semiconductor image sensors.

BACKGROUND TO THE INVENTION

CMOS image sensors are used in a wide range of applications. In many applications, the sensor is operated with a so-called rolling shutter mode. If the exposure period needs to be reduced, the timing of the sensor is adapted so that only a sub-set of the total set of rows in the sensor array are integrating light during the image readout time. This sub-set of rows can be considered as a window which rolls over the focal plane array, hence the name 'rolling shutter'.

Some applications, such as machine vision and motion analysis, demand a global shutter (also called a snapshot shutter) which allows the capture of all of the pixels of the sensor during the same time period. There are two main types of global shutters: a triggered global shutter and a pipelined global shutter. In a triggered global shutter the image must be read out before the next image can be captured. In a pipelined global shutter a new image can be captured during the readout of the image data from the previous image. Triggered global shutters are typically used in machine vision where an object needs to be inspected. Pipelined global shutters are typically used in motion analysis and high frame rate cameras. In a continuous recording mode, a pixel with a pipelined shutter is sensitive at all times.

Image sensors can be implemented using Charge Coupled Device (CCD) technology or Complementary Metal Oxide Semiconductor (CMOS) technology. An interline-transfer CCD device inherently allows pipelined global shutter operation. However, it is more difficult to implement a global shutter in CMOS image sensors. There have been several proposals for providing a global shutter in a CMOS image sensor. U.S. Pat. No. 7,224,389 shows a pipelined synchronous shutter pixel. The pixel comprises a photodiode, a reset transistor, a first buffer amplifier, a sample capacitor and a second buffer amplifier. The next image can be acquired during readout of an image, thus allowing pipelined shutter operation. The pixel does not allow cancelling non-uniformities caused by threshold voltage variations in the buffer amplifier or reset transistors in pipelined shutter operation. There is no possibility to obtain a reference level of the pixel during readout of the image, without destroying the signal on the photodiode, which will be capturing the next image in pipeline shutter operation.

The paper "A 600×600 pixel, 500 fps CMOS Image Sensor with a 4.4 μm Pinned Photodiode 5-Transistor Global Shutter Pixel", I. Takayanagi, et al, proc. International Workshop on Image Sensors, Maine, June 2007, p. 287 describes a 5-transistor pixel which can perform a pipelined shutter operation and fixed pattern noise correction. U.S. Pat. No. 6,847,070 shows a 5-transistor pixel with the same topology. The pixel is shown in FIG. 1 and comprises a pinned photodiode, a transfer gate, a floating diffusion, a reset transistor, a source follower, a selection transistor and a separate anti-blooming transistor connected to the photodiode. The floating diffusion is used for storage of the signal during exposure of the next signal. A reference level can be read out by resetting the floating diffusion after the readout. The pixel thus allows fixed pattern noise correction and pipelined shutter operation. However, storing charges at the floating diffusion has several drawbacks. The floating diffusion is light sensitive, which means that the signal stored at the floating diffusion will be influenced by light collected during the storage time. Since the time that the signal is stored at the floating diffusion is larger at the last rows of the image than at the first rows, this can create a (light-dependent) gradient in the image, with a brighter area near the last rows of the image. A second problem is that the storage node is a surface junction which has a considerable leakage current. This leakage current will be added to the signal stored on the storage node, and thereby increase the noise on the sample. An additional anti-blooming transistor in the pixel is utilized to drain away excess charges, which might otherwise disturb the signal stored on the floating diffusion. The anti-blooming transistor can also be used to drain the photodiode during part of the readout time, when the required shutter time is lower than the frame readout time.

U.S. Pat. No. 7,286,174 describes a dual storage node pixel which is intended to store the signal level of a photosite recorded in each of two different frames, such as a high-speed imaging application where a scene is differently lit between two frames. A signal level of the photosite is transferred to one of the storage capacitors after each exposure. This signal is either transferred in the charge domain, in which case the charge is converted to voltage on the storage capacitor, or in the voltage domain, in which case the signal is converted to a voltage on the photosite.

Fixed pattern noise in CMOS pixels is largely caused by threshold voltage variations of the different transistors inside the pixel. The buffer amplifier (source follower) and also the reset transistor in the pixel will have variations in threshold voltage. Some reasons for the threshold voltage variations are local variations in dopant concentration in the transistor channel, oxide thickness, and dopant concentration of the gate. This threshold voltage variation results in a variable offset level of the pixel output signal. Usually, this offset variation is cancelled by measuring a reference level of the pixel which does not contain a photosignal, and subtracting this reference level from the measured signal level. To perform noise correction, the pixel must support measurement of this reference level.

The present invention seeks to provide a pixel, and a pixel array, which is capable of global shutter operation and which overcomes at least one of the problems of existing pixels.

SUMMARY OF THE INVENTION

A first aspect of the present invention provides a pixel comprising:
a photo-sensitive element for generating charges in response to incident radiation;
a sense node;
a transfer gate, connected between the photo-sensitive element and the sense node, for controlling transfer of charges to the sense node;
a reset switch connected to the sense node for resetting the sense node to a predetermined voltage;
a first buffer amplifier having an input connected to the sense node;
a sample stage, connected to the output of the first buffer amplifier, which is operable to sample a value of the sense node; and,
a second buffer amplifier having an input connected to the sample stage.

An advantage of a pixel according to an embodiment of the invention is that the pixel suffers much less from parasitic light sensitivity and leakage because a signal representative of the amount of radiation incident on the photo-sensitive element during an exposure period is stored in the sample stage, behind the first buffer amplifier, advantageously on a capacitor.

A further advantage of a pixel according to an embodiment of the invention is that is possible to reset the sense node during an exposure, and to read the reset level of the sense node during an exposure without destroying the signal that is being acquired on the photo-sensitive element. This can allow pixels to be operated with lower fixed pattern noise in either of the global shutter modes, i.e. triggered global shutter mode and pipelined global shutter mode. The reduction of fixed pattern noise is particularly important for high speed cameras, because it allows a much higher gain at the output of the image sensor. In triggered synchronous shutter mode, the temporal noise can be reduced as well. Fixed pattern noise is reduced by differential sampling of the pixel. First the signal level is read out. Then, the pixel reset level is measured and read out. The final image is calculated by subtracting the reset level from the signal level. This subtraction is typically, but not necessarily, performed on-chip in the column or output amplifiers. This subtraction considerably reduces the fixed pattern noise created by spatial variations in offset level between pixels. Both samples share the same transistors for their readout, and will have the same offset level. Any spatial variation in offset level amongst pixels is not observed in the differential image.

A further advantage is that the pixel provides anti-blooming protection through the existing transfer gate and reset transistor. In the case of over-exposure of a pixel, excess charge can be drained away via the reset gate, which is conductive during the exposure, and via the transfer gate, which is not conductive for high voltages on the photodiode, but which starts to conduct when the voltage on the photodiode falls below a certain voltage level, which is typically located around −0.4V. Other pixel types require a separate second anti-blooming transfer gate connected to the photodiode and leakage on the anti-blooming transfer gate may disturb the signal captured on the photodiode.

Advantageously, the sample stage comprises a sample switch connected to an output of the first buffer amplifier and a capacitor for storing a signal level sampled by the sample switch.

There are various circuit topologies, and timing strategies, for the pixel. In one embodiment a dedicated discharge switch is provided for resetting (discharging) the sample stage. In another embodiment, a dedicated read switch is connected to the output of the second buffer amplifier for reading a signal from the pixel. In other embodiments, the functions of resetting (discharging) the sample stage and/or reading an output of the second buffer amplifier can be achieved using other circuit elements of the pixel, with appropriate application of control signals to those circuit elements.

In some embodiments, the first buffer amplifier is connected to a first control line and the first control line is operable to discharge the sample stage at a certain point during an operating cycle of the pixel.

In one embodiment, the sample stage comprises a sample switch connected to a first node and a capacitor connected in series with the sample switch and both of the input to the second buffer amplifier and the output of the first buffer amplifier are connected to the first node.

Another aspect of the invention provides a pixel array comprising an array of pixels of the type described above, and in the accompanying description, and control circuitry for controlling operation of the pixels in the array.

Advantageously, the control circuitry is arranged, for each pixel, to: operate the reset switch to reset the sense node; operate the transfer gate of a pixel to transfer charge from the photo-sensitive element to the sense node following exposure to radiation; cause the sample stage of the pixel to sample the signal on the sense node, which sampled signal represents an exposure level of the pixel.

Advantageously, an exposure level of a pixel and a reset level of a pixel is sampled and read out to effect double sampling. The control circuitry is arranged to: read the sampled exposure level of the pixel; and subsequently, to: cause the sample stage to sample the sense node after it has been reset, which sampled signal represents a reset level of the pixel; and, read the sampled reset level of the pixel.

Advantageously, a reset level of a pixel is sampled before an exposure level of a pixel to effect correlated double sampling. The control circuitry is arranged to: cause the sample stage of a pixel to sample the reset level of the pixel; operate the transfer gate of a pixel to transfer charge from the photo-sensitive element to the sense node following exposure to radiation, which transferred charge represents an exposure level of the pixel, and storing the transferred charge at the sense node until after the reset level has been read from the sample stage.

Advantageously, the control circuitry is arranged to operate the reset switch while the photo-sensitive element is being exposed to radiation. This can allow anti-blooming control, via the existing transfer gate, without the need for dedicated anti-blooming gates connected to the photo-sensitive element. The control circuitry can operate (i.e. close) the reset switch at all times other than when it is required to transfer charge to the sense node and sample a value of the sense node.

Advantageously, the control circuitry is arranged to read the sampled value of a pixel for a first exposure period while the photo-sensitive elements of the pixel is exposed for a second exposure period and, more advantageously, the control circuitry is arranged to read a value stored in the sample stage of each pixel in the array for a first exposure period while the respective photo-sensitive elements of the pixels in the array are exposed for a second exposure period.

Advantageously, the control circuitry is arranged to cause the array of pixels to be exposed synchronously.

Advantageously, at least one of: the first buffer amplifier and the second buffer amplifier are shared by a plurality of photo-sensitive elements. This has an advantage of reducing the number of devices in the pixel array and can simplify the layout.

Advantageously the photo-sensitive element in any of the described embodiments is a pinned photodiode, which has an advantage of maximising the amount of transferred charge.

Advantageously, the pixel, or pixel array is fabricated in CMOS technology.

The pixel can comprise a single sample stage or it can comprise multiple sample stages. The multiple sample stages can be arranged in parallel, with each sample stage being connected to an output of the first buffer amplifier and selectively operable to sample a value of the sense node. Each sample stage can comprise an output buffer amplifier or a single output buffer amplifier can be shared by the multiple sample stages on a time-shared basis. Alternatively, the multiple sample stages can be arranged in cascade.

One of the sample stages can sample a reset level of the sense node while another of the sample stages stores an exposure level. Advantageously, the reset level is sampled before causing charge to be transferred from the photo-sensitive element to the sense node, which allows correlated double sampling (CDS). The reading of the sampled values can occur while the photo-sensitive element is being exposed to radiation, in a pipelined manner. Alternatively, the multiple sample stages can be used to store exposure levels for subsequent frames. The pixel, or pixel array readout circuitry, can include circuitry to derive a difference between the sampled values. Alternatively, multiple sample stages can be used to store exposure levels of frames captured with different exposure times. The pixel array readout electronics can then include circuitry to reconstruct a high dynamic range image composed of the multiple exposures. In the case where the first sample stage stores a sample of a first exposure and the second sample stage stores a sample of a second exposure, readout can occur while a third exposure is being acquired by the photo-sensitive element.

Another aspect of the invention provides an imaging apparatus comprising a pixel, or a pixel array, as described herein, or as defined in any of the claims.

Another aspect of the invention provides methods of operating a pixel, or a pixel array as described herein, or as defined in any of the claims. In the method claims, some steps can be performed in a different order to the order recited in the claims, without deviating from the scope of the invention.

BRIEF DESCRIPTION OF THE DRAWINGS

Embodiments of the invention will be described, by way of example only, with reference to the accompanying drawings in which.

DESCRIPTION OF PREFERRED EMBODIMENTS

Figure 1:
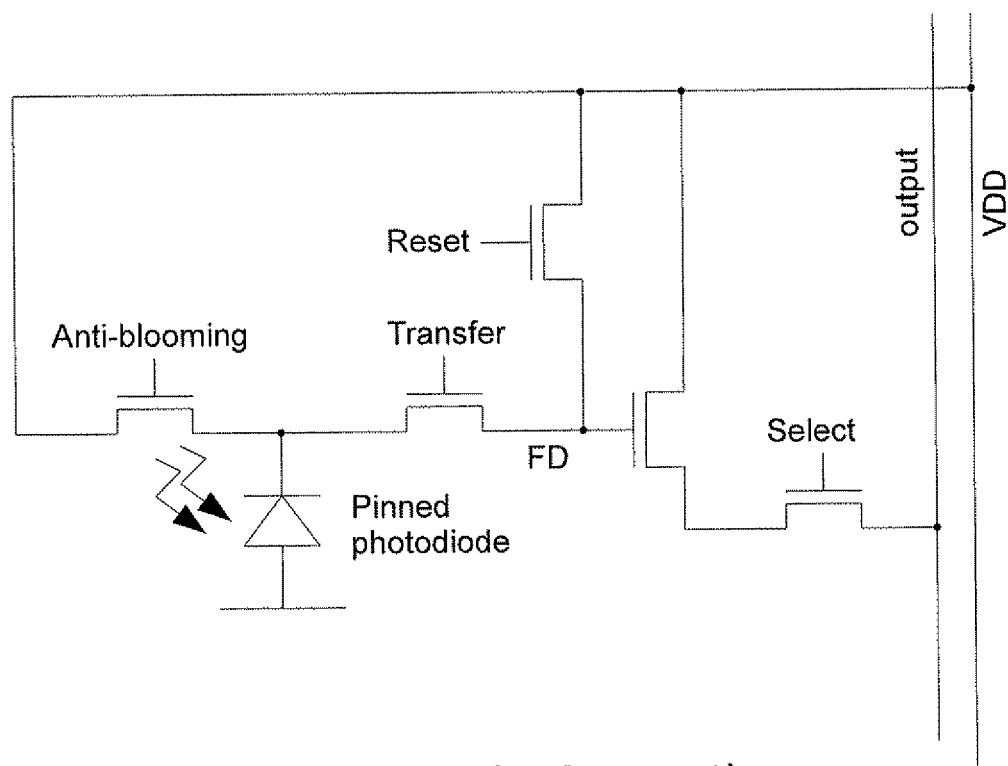
FIG. 1 shows a prior art 5-transistor pixel for use in performing pipelined global shutter operation.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Throughout this specification, it should be noted that the term "row" and "column" can be interchanged. Also, the term "row" does not imply a particular orientation of the array.

Figure 2:
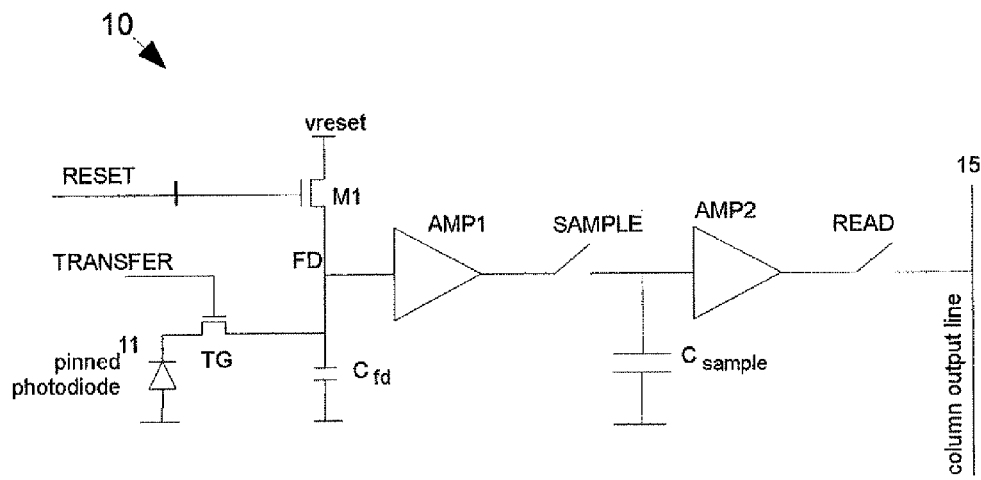
FIG. 2 schematically shows a pixel in accordance with an embodiment of the invention.

FIG. 2 schematically shows a first embodiment of a pixel 10. A full image sensor comprises an array of the pixels 10 shown in FIG. 2, with the pixels typically being arranged in rows and columns. The pixel 10 comprises a photodiode 11 (preferably a pinned photodiode) which is responsive to electromagnetic or particle radiation, although most typically this will be light in the visible band. A transfer gate TG connects the cathode of the photodiode 11 to a floating diffusion capacitor $C_{fd}$. The floating diffusion capacitor $C_{fd}$ is typically the junction capacitance formed by the transfer gate TG and reset transistor source areas, although an additional dedicated capacitor can be located at this node as well. In the following description, the terms "floating diffusion" and "sense node" refer to the same feature. The transfer gate TG is responsive to a control signal TRANSFER and, when the transfer gate TG is opened, it is able to transfer substantially all charge from the pinned photodiode 11 to the floating diffusion capacitor $C_{fd}$. A reset transistor (switch) is responsive to a control signal RESET and is operable to initialise the floating diffusion FD to a known voltage (vreset). A first buffer amplifier AMP1 buffers the voltage of the floating diffusion FD, at the input of the first buffer amplifier, to an output of the amplifier. A sample transistor is connected to the output of the first buffer amplifier AMP1 and is operable to sample the signal level and to store the signal level on a sample capacitor $C_{sample}$. The sample capacitor $C_{sample}$ stores the sampled signal of the pixel. A second buffer amplifier AMP2 is connected to the sample capacitor $C_{sample}$ and is operable to buffer the signal level of the sample capacitor. An optional read switch connects the output of the second buffer amplifier AMP2 to a column output line 15, and is operable to select the pixel during a read out process. A preferred embodiment of the pixel uses a pinned photodiode 11. This ensures a low dark current and fixed pattern noise correction. To acquire an image, each pixel is operated as follows:

1. At the start of an exposure period, the pinned photodiode 11 is empty and does not contain any photocharges.
2. The image is acquired during the exposure period. Radiation incident on the pinned photodiode 11 generates photocharges which are collected inside the pinned photodiode 11.
3. (At least) at the end of the exposure time, the floating diffusion FD is reset by pulsing the reset transistor M1. The FD can be held in the reset state at all times except when transferring charge transfer to the floating diffusion (step 4) and sampling the signal (step 5).
4. Charge is transferred through the transfer gate TG by pulsing the transfer line. The charge Q will generate a voltage swing on the capacitor $C_{fd}$. This swing is equal to $Q/C_{fd}$.
5. The voltage signal is buffered by the first buffer amplifier AMP1 and stored on the sample capacitor $C_{sample}$ by pulsing the sample switch.
6. After the charge transfer, the photodiode 11 is depleted. It does not contain any remaining charge. Optionally, an additional reset can be generated to ensure that all charge is evacuated from the photodiode 11. This reset is achieved by pulsing the reset transistor M1 and the transfer gate TG together.

7. When the transfer gate TG opens again, the next exposure time can start. This may happen immediately after this image capture sequence or later (to reduce the exposure time below the image read time).

8. Optionally, but also advantageously, the floating diffusion can be reset again by setting the RESET line high. This allows to drain away excess charge from the photodiode through the transfer gate TG and reset transistor M1 during exposure of the next image.

For global shutter operation, all of the above operations occur synchronously for all pixels of the array. In other words, step 1 occurs at the same time for every pixel of the array, step 2 occurs at the same time for every pixel of the array, and so on. After this image acquisition sequence, the readout of the frame can start. For a pipelined global shutter the read out occurs during the capture of the next frame by photodiode 11. To read out the frame which has just been acquired, the signal sampled on $C_{sample}$ is read out through buffer amplifier AMP2 and the read transistor. This is done sequentially, by scanning over the array, row by row. The signal levels of the row are sampled in the column amplifier (shown in FIG. 6). Then, the sample capacitors $C_{sample}$ of this row are reset by sampling the reset level on capacitor $C_{sample}$. When the reset transistors are switched on for all pixels during the exposure, this reset level can be simply sampled by closing the SAMPLE switch for the row of pixels that are read out. In the case when the reset switch is not closed, the RESET line should be pulsed together with the SAMPLE line for the row that is read out. This reset level is also read out and stored in the column amplifier. The difference between this reset level and signal level is calculated either by analog or digital circuits and output from the sensor. This difference is free of offset errors in the pixel or in the column amplifiers. The reading of the signal level and reset level can be achieved without disturbing the signal stored on the pinned photodiode 11.

Figure 3:
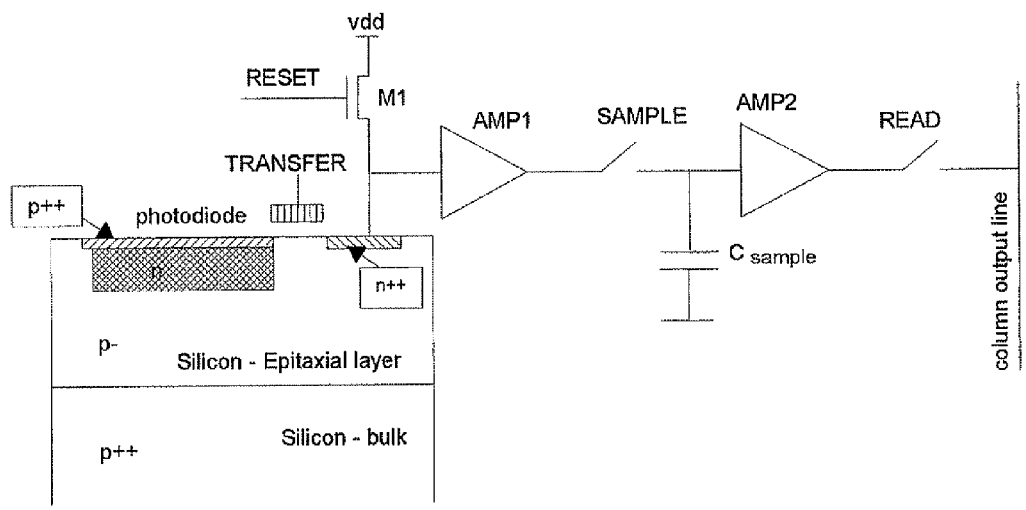
FIG. 3 shows further detail of the physical structure of the pixel of FIG. 2.

FIG. 3 shows more details on the implementation of the pinned photodiode and the transfer gate. The diode is constructed in an epitaxial layer which is lowly doped (typically 5E14/cm$^3$). This epitaxial layer is grown on high conductive bulk material (p++, >1E19/cm3 or n++, >1E19/cm3). The photodiode is formed by a deep n-type implant, with a net concentration near 1E17/cm3. The surface is covered by a p++ layer (highly doped, 1E19/cm3). The doping level of the n-implant is chosen such that the diode is depleted at a low voltage (near 1 V). When light enters the silicon, it generates electron-hole pairs inside the epitaxial layer. The electrons are collected by the photodiode and the voltage on the diode falls. The diode is coupled to a transfer gate, which allows to read out the diode charge when a high voltage is applied to the transfer gate. The transfer gate connects the photodiode with the floating diffusion. When the transfer gate is pulsed, the charge is transferred on this floating diffusion capacitor and a voltage swing will occur.

Figure 4A:
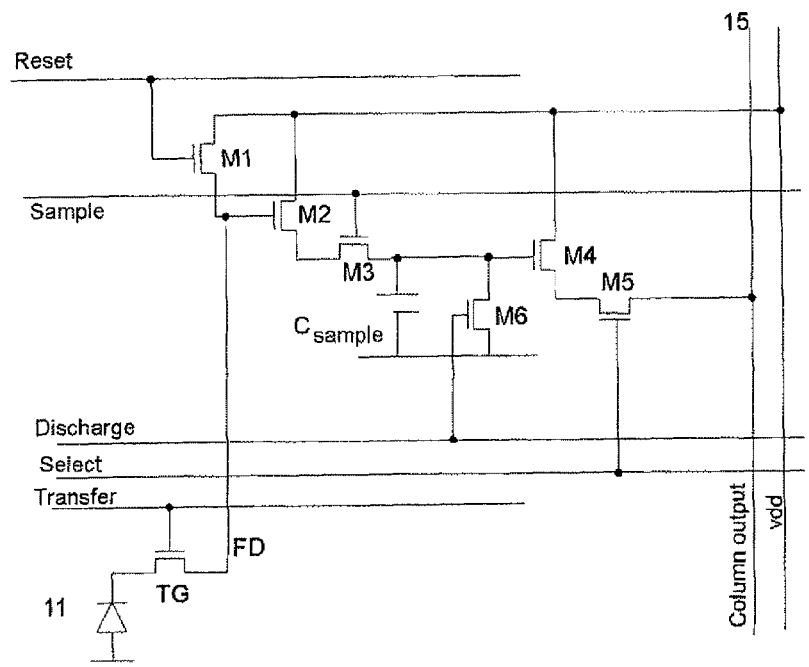
FIGS. 4a-4d show transistor schematics of a pixel in accordance with embodiments of the invention.

FIGS. 4a-4d show schematic diagrams for realising embodiments of the pixel of FIGS. 2 and 3 using transistors. FIG. 4a shows a transistor schematic of an embodiment of the pixel which contains seven transistors in total (transistors M1-M6 plus the transfer gate TG). M1 is the reset transistor; M2 is the first buffer amplifier; M3 is the sample transistor; M4 is the second buffer amplifier; M5 is the read transistor; and M6 is a discharge transistor. Each of the buffer amplifiers M2, M4 is a transistor configured as a source follower. A transfer transistor TG is connected between the pinned photodiode 11 and floating diffusion (sense node) FD. Reset transistor M1 is connected between supply line vdd and the floating diffusion FD. Reset transistor M1 is responsive to a control signal RESET. Buffer amplifier transistor M2 has a gate connected to the floating diffusion FD and a drain connected to supply line vdd. Sample transistor M3 is connected between the output (source) of transistor M2 and the input (gate) of buffer amplifier M4. The gate of sample transistor M3 is responsive to a control signal SAMPLE. Sample capacitor $C_{sample}$ is connected between the input (gate) of buffer amplifier M4 and a fixed voltage level, such as GND, VDD, or a separate voltage provided to the pixel. Discharge transistor M6 is connected between the input (gate) of buffer amplifier M4 and ground and is responsive to a control signal DISCHARGE. Buffer amplifier M4 is configured as a source follower, with the drain of M4 connected to supply line vdd and the source of M4 connected to the column output line via read transistor M5. The gate of read transistor M5 is responsive to a control signal SELECT.

Before the buffer amplifier M2 samples the signal on the floating diffusion FD, the sample capacitor $C_{sample}$ is discharged through discharge transistor M6. Then, after M6 is open again, transistor M3 is closed and the signal of the floating diffusion FD will appear also at the sample capacitor $C_{sample}$ via source follower M2 and sample transistor M3. In FIG. 4a, the capacitor $C_{sample}$ is discharged through a dedicated transistor M6. This requires an extra ground connection to the pixel. Although the sample capacitor $C_{sample}$ is shown connected to ground, it may alternatively connected to another fixed voltage, e.g. VDD, or to a separate control line to increase the signal swing. Transistor M6 can also be placed at the source of the source follower/buffer amplifier M2. The sample capacitor $C_{sample}$ is in this case discharged through discharge transistor M6 and closed transistor M3. Note that the gate of M6 can be switched or DC. In the latter case, M6 acts as current source load for the source follower.

Figure 4B:
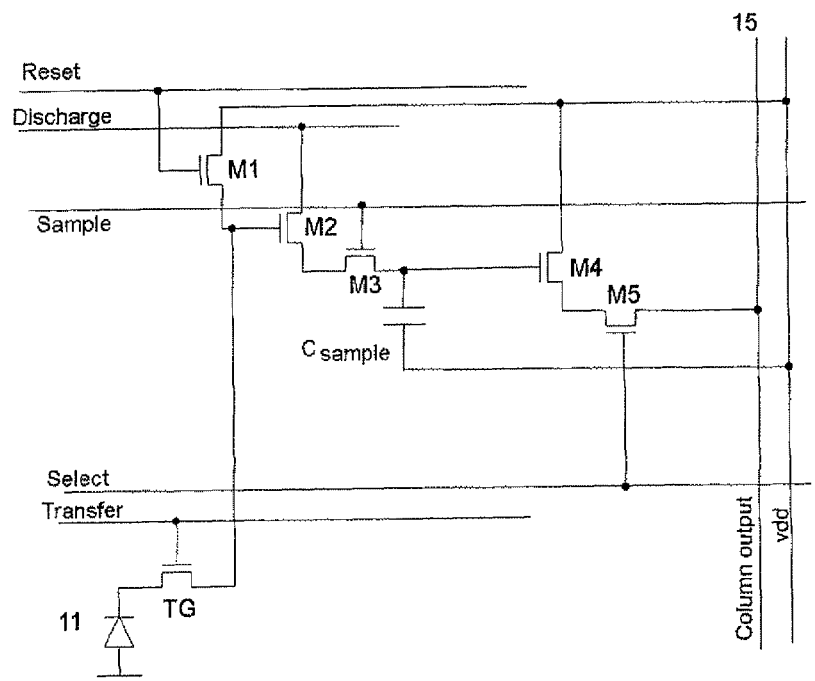

FIG. 4b shows a schematic for an alternative embodiment of the pixel. In this embodiment, discharge transistor M6 shown in FIG. 4a is not required. Instead, the discharge of capacitor $C_{sample}$ is performed via the transistor M2. The drain of buffer amplifier M2 is connected to the control line DISCHARGE rather than the supply line vdd as in FIG. 4a. To discharge $C_{sample}$ the reset transistor M1 is switched on, so that the floating diffusion FD appears at a high voltage (reset transistor M1 is typically already switched on during most of the exposure time). This will turn on M2. M3 is also switched on. The drain of M2 is pulsed low, by an appropriate signal on the DISCHARGE control line, to discharge capacitor $C_{sample}$. After this discharge, reset transistor M1 is switched off, and the charge is transferred to the floating diffusion FD by pulsing the transfer gate TG. This signal is then sampled on $C_{sample}$. After the sampling process, M3 is switched off again. An advantage of this schematic is the lack of a ground line in the pixel, and the pixel requires one less transistor (a total of six transistors).

Figure 4C:
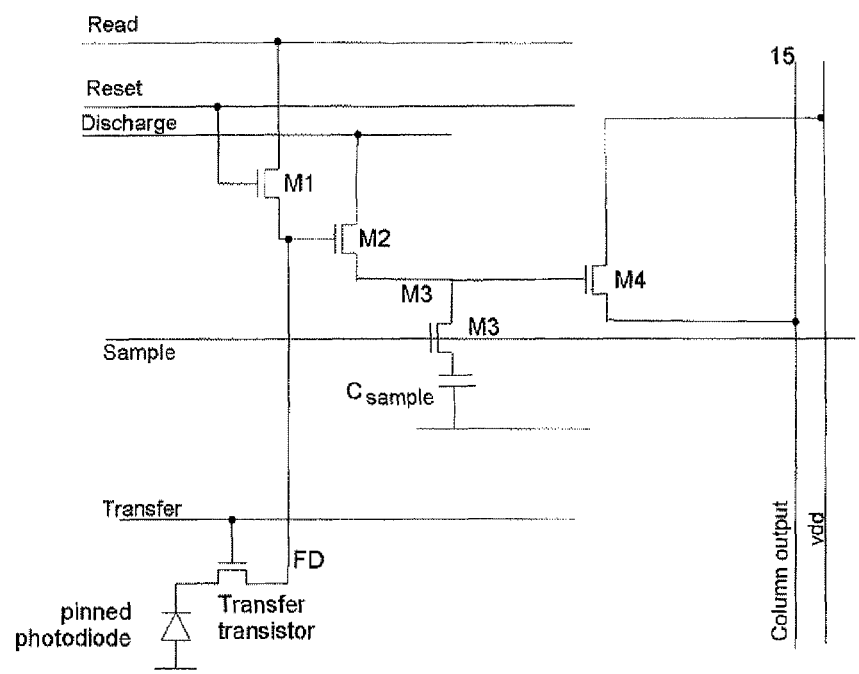

FIG. 4c shows another embodiment of the pixel. In this embodiment, the select transistor (M5 in previous drawings) is eliminated as well. The output (source) of buffer amplifier M4 is connected directly to the column output line 15. The input (gate) of buffer amplifier M4 is connected to the output (source) of buffer amplifier M2. The sample transistor M3 and the sample capacitor $C_{sample}$ are connected in series between the gate of M4 and a fixed bias level (ground, VDD or another fixed voltage). In this way, the signal held on the sample capacitor $C_{sample}$ is shielded by the sample transistor M3. The gate of M4 is kept at a low level for most of the time through transistor M2. During the sampling process, transistor M3 is pulsed to store the signal on $C_{sample}$.

For most of the time, the voltage on the DISCHARGE line is low (ground or a low voltage) whilst RESET is kept high. This keeps the source of M2 at a low voltage (the voltage applied to the DISCHARGE line, normally ground). The capacitor $C_{sample}$ is discharged by pulsing the SAMPLE line high for some time, so that transistor M3 is conductive and samples this low voltage.

For readout of the photodiodes, the RESET line is set low to put the sense node FD at a floating potential, and the DISCHARGE signal line is set to a high voltage. Then the transfer gate is pulsed. The voltage on the floating diffusion FD will fall, and so will the voltage at the source of M2. M3 is conductive at this moment and will sample the voltage at the source of M2. Then the SAMPLE line goes low again to open switch M3, and a next exposure can start on the photodiode 11. During readout, the lines are scanned row-by-row. For all rows except the row that is read out, the DISCHARGE line is kept low (near ground) and the RESET line is kept high. This keeps the gate of M4 at ground potential, and the pixels do not control the column output line. For the row which is read out, the DISCHARGE line is raised to a high voltage. This puts the reset level at the gate of M4, and this signal is transferred through source follower M4 to the column line. To read out the value sampled on $C_{sample}$, the floating diffusion FD is pulled to a low voltage by putting a low voltage on the READ line for the row that is read out. This switches off M2. Then transistor M3 is closed by pulsing SAMPLE for the row that is read out, and the voltage swing is measured at the output of the pixel on the column line. It is also possible to use the VDD line to control read out, using a more complex timing arrangement.

Figure 4D:
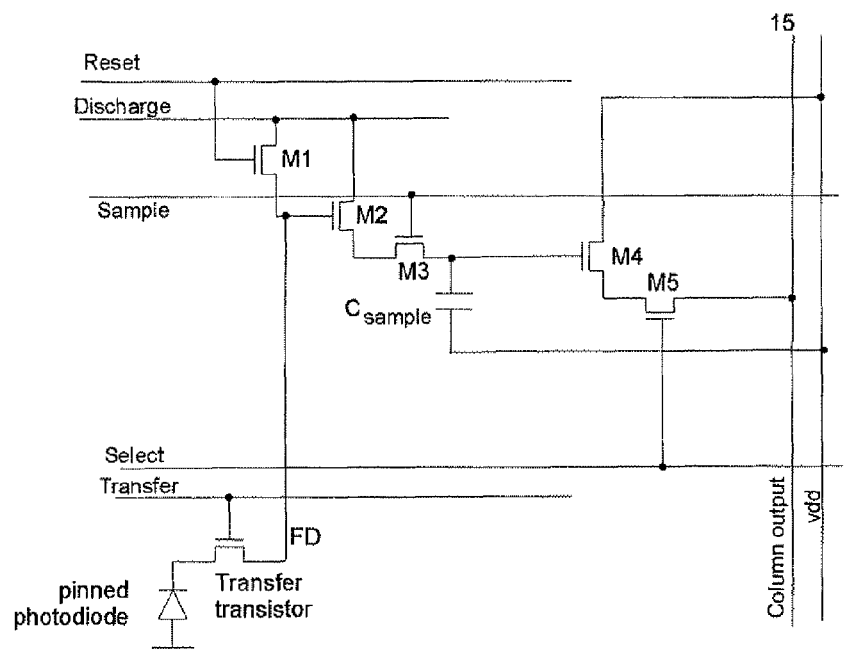

FIG. 4d shows an alternative embodiment to that of FIG. 4b, in which the drain of reset transistor M1 is also tied to the discharge line. The timing of the discharge line is adapted to ensure that the floating diffusion is at a high voltage at the moment when the capacitor $C_{sample}$ needs to be discharged. To discharge, the DISCHARGE control line is pulsed to a low voltage and M3 is conductive at that moment. This embodiment may result in more efficient routing inside the pixel, depending on the exact pixel layout. A possible disadvantage is that the floating diffusion FD is also pulsed.

Figure 5:
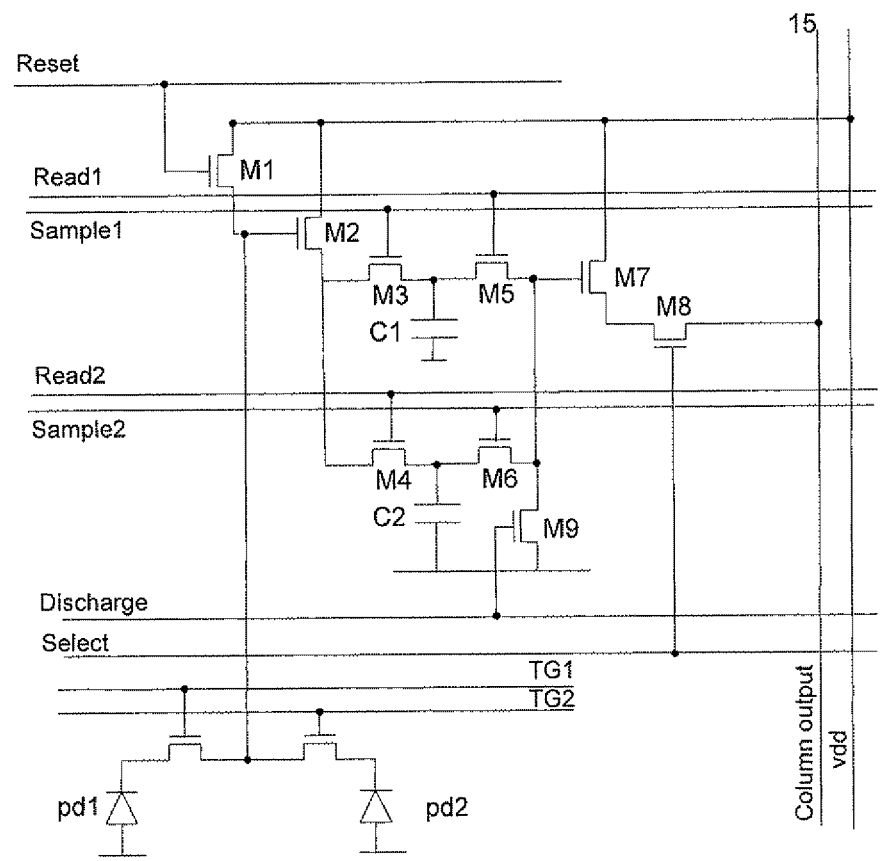
FIG. 5 shows an embodiment of the invention with a shared sample and storage stage for two pixels.

FIG. 5 shows another embodiment of the pixel. The numbering convention of the transistors is different to previous embodiments. In this embodiment, two photodiodes pd1, pd2 are coupled to a partially common pixel readout circuit. The first photodiode pd1 is connected via a dedicated transfer gate 1 to the floating diffusion FD. The second photodiode pd2 is also connected via a dedicated transfer gate 2 to the floating diffusion FD. There is a single reset transistor M1 and a single first buffer amplifier M2, which are shared by both photodiodes. There is also a single second buffer amplifier M7 and a single read transistor M8 which are shared by both photodiodes. There are individual sample and storage stages for each of the photodiodes: a first of these comprises transistors M3, M5 and sample capacitor C1; the second comprises transistors M4, M6 and sample capacitor C2. There is a single discharge transistor M9 for discharging sample capacitors C1, C2. In the sampling process, first the signal of photodiode 1 is transferred to the floating diffusion FD and copied to storage capacitor C1. The floating diffusion FD is reset and then the signal of photodiode 2 is transferred to the floating diffusion FD and copied to storage capacitor C2. The signal stored on each of the storage capacitors C1, C2 is read out through source follower M7, and switches M5, M6 and M8. The signals on C1, C2 are read one at a time. Transistor M9 acts together with either M5 or M6 to discharge the capacitors C1 or C2 before the floating diffusion FD signal is sampled.

The arrangement shown in FIG. 5 can be extended to other numbers of photodiodes, with each additional photodiode requiring a transfer gate and a sample and storage stage (transistors M3, M5 and capacitor C1) but sharing other components. The number of photodiodes will typically be limited by layout constraints. Another advantageous configuration (not shown) is a shared readout for a group of four photodiodes arranged in a 2×2 array. The readout section can be located in the centre of the four photodiodes. An advantage of these configurations with a (partially) shared readout structure is a more compact layout.

Figure 6:
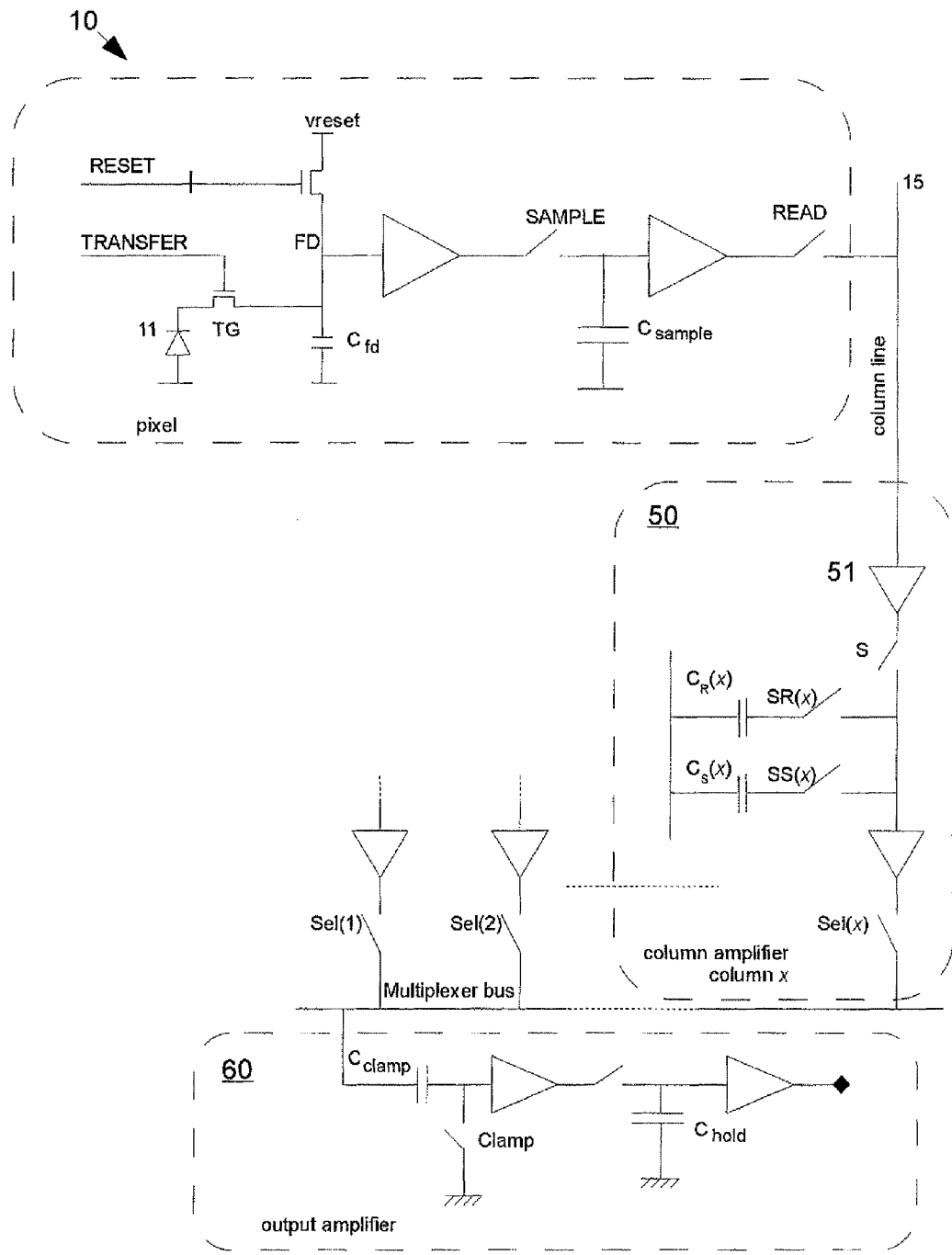
FIGS. 6 and 15 show the architecture of a pixel array.

FIG. 6 shows a readout architecture for double sampling in the column and output amplifiers. The overall image sensor comprises an array of the pixels described in any one of FIGS. 2-5. Typically, the individual pixels are arranged in rows and columns, with control lines extending parallel to the rows and/or columns and output lines per column of pixels. FIG. 6 shows one pixel 10 (the pixel of FIG. 2) which can be selectively connected to a column output line via a READ switch. A large number of similar pixels will also be selectively connected to the same column output line in a time-multiplexed manner. Each column has a column output stage 50 which comprises a column amplifier and associated hardware. An output stage receives inputs, in a time-multiplexed manner, from the column output stages. In use, each pixel in a column of pixels is read, in a time-multiplexed manner, by connecting the pixel to the column output line via the READ switch. A row of pixels can be simultaneously read in this way, with each pixel in the row outputting a signal to a respective column output line. Outputs from the set of column amplifiers are applied, in a time-multiplexed manner, to the output stage.

The output amplifier 60 calculates the difference between the two samples (reset level, signal value) obtained from each pixel. The subtraction works as follows. For each pixel, the reset and signal values are passed sequentially to the input of the output amplifier via the multiplexer bus. When the first sample (e.g. reset value) is applied to the input of the output amplifier 60, the switch 'Clamp' is closed. The first sample is then sampled on the series capacitor $C_{clamp}$. Then, the switch opens again and the second sample (e.g. signal value) is applied to the input of the amplifier (at the left side of the series capacitor). At the other side of the series capacitor $C_{clamp}$ the difference between the second sample and first sample will appear. The clocking of the 'clamp' switch is illustrated in the timing diagram of FIG. 9. The second switch and capacitor in the amplifier are used as a track and hold. This stage will track the signal (switch closed) when the subtracted signal is available at the output of the first buffer (this is when the second sample is applied), and will be in hold (switch open) when the first sample is applied (the differential signal of the previous sample is then still available at the output of the output amplifier). There are various known alternative schemes for processing the outputs of a pixel array which can be used in place of the one described here. For example, a column processing unit associated with each column of the pixel array can perform an analog-to-digital conversion of the difference between the reset level and the sample signal.

Figure 15:
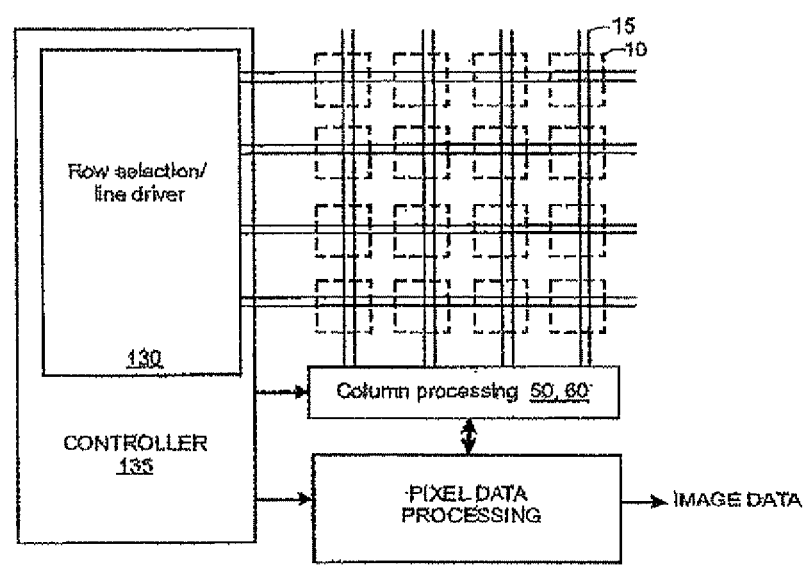

FIG. 15 shows an overall architecture for a pixel array/image sensor. A simplified four pixel by four pixel array is shown. Each pixel 10 is as previously shown in FIGS. 2, 3, 4a-4d, or a set of pixels with a shared read out circuitry as shown in FIG. 5. A controller 135 includes row selection/line driver circuitry 130 for driving pixels in the array. Controller 135 controls selection of pixels, and generates the control signals RESET, TRANSFER, SAMPLE, DISCHARGE and SELECT to control each pixel. The timing of these control signals will be described below with reference to FIGS. 7a, 7b, and 8. Controller 135 can perform a global shutter function by synchronizing operation of the control signals which control respective exposure times of each of the pixels of the array. Controller 135 also controls, via column processing circuitry 50,60, operation of the column amplifiers and read out from the column amplifiers. The control logic of controller 135 can be stored in hard-coded form, such as in an Application Specific Integrated Circuit, or it can be stored in some form of reconfigurable storage, such as a logic array (programmable array, reconfigurable array) or a general-purpose processor which executes control software. All of the elements shown in FIG. 15 can be provided on a single semiconductor device or the elements can be distributed among several separate devices.

Figure 7A:
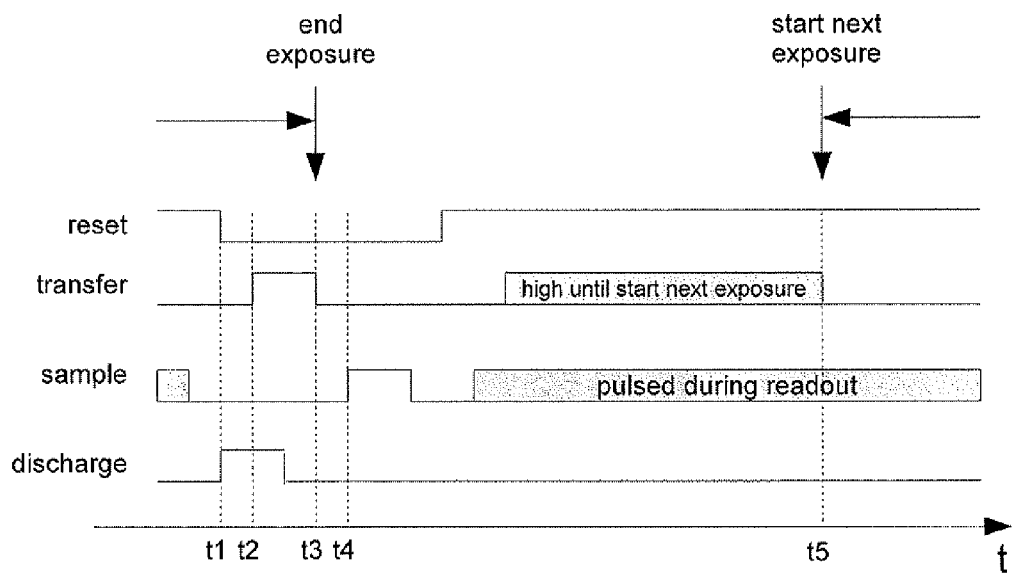
FIGS. 7a and 7b show timing diagrams for operation of the pixels shown in FIGS. 4a-4d.
Figure 7B:
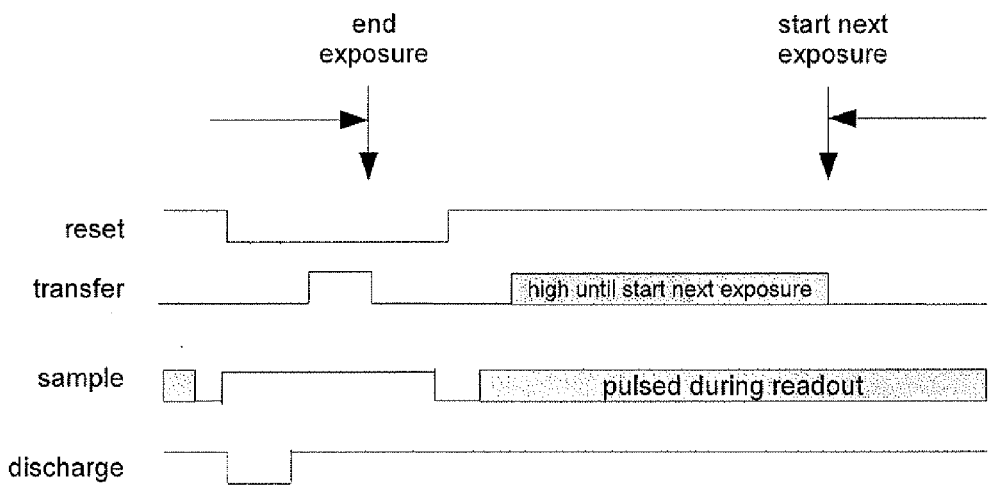

FIGS. 7a and 7b show timing diagrams for the acquisition of an image and storage of the image in the pixel sample capacitors $C_{sample}$. FIG. 7a shows the timing for a pixel as in FIG. 4a, with a dedicated discharge transistor M6. FIG. 7b shows the timing for a pixel as in FIG. 4b or 4c in which the capacitor $C_{sample}$ is discharged via the source follower M2.

Referring to FIG. 7a, the exposure time for the photodiode 11 starts as soon as the transfer gate TG is opened. Towards the end of the exposure period, the floating diffusion is reset, and the reset switch opens again (t1), in preparation for the transfer of charge from the photodiode 11. The sample capacitor $C_{sample}$ is also discharged in preparation for sampling the signal of the photodiode. At t2, towards the end of the exposure period, the transfer gate TG is pulsed for all pixels of the array in parallel (global shutter). Charge is transferred from the pinned photodiode 11 to the floating diffusion FD of the pixel. The exposure period ends when the transfer gate TG is opened at t3. At t4 the signal is sampled by pulsing the sample transistor M3. Optionally, the reset switch M1 and transfer gate TG close again to reset the floating diffusion FD and evacuate any remaining charge on the photodiode 11. The next exposure time starts at t5 as soon as the transfer gate is released. The state of the reset line during the exposure can be low but is advantageously kept high. When kept at a high level, it keeps the floating diffusion FD at a high voltage at all times. Excess charge on the photodiode in case of overexposure of the pixel can be drained away via the transfer gate and reset transistor in this case. The sampled signal level, which is now stored on the sample capacitor $C_{sample}$, can be read at any point during the next exposure period. After readout of the value on $C_{sample}$, the reset level is read out to provide a reference offset level of the pixel. To do that, the SAMPLE line is pulsed for the row that is read out. This brings the reset level to the gate of M4. This operation is typically performed after readout of $C_{sample}$. In FIG. 7b the DISCHARGE line is set low at the moment when the sample capacitor $C_{sample}$ needs to be reset. The floating diffusion ED is at a high voltage at this moment and this ensures that M2 is conductive.

Figure 8:
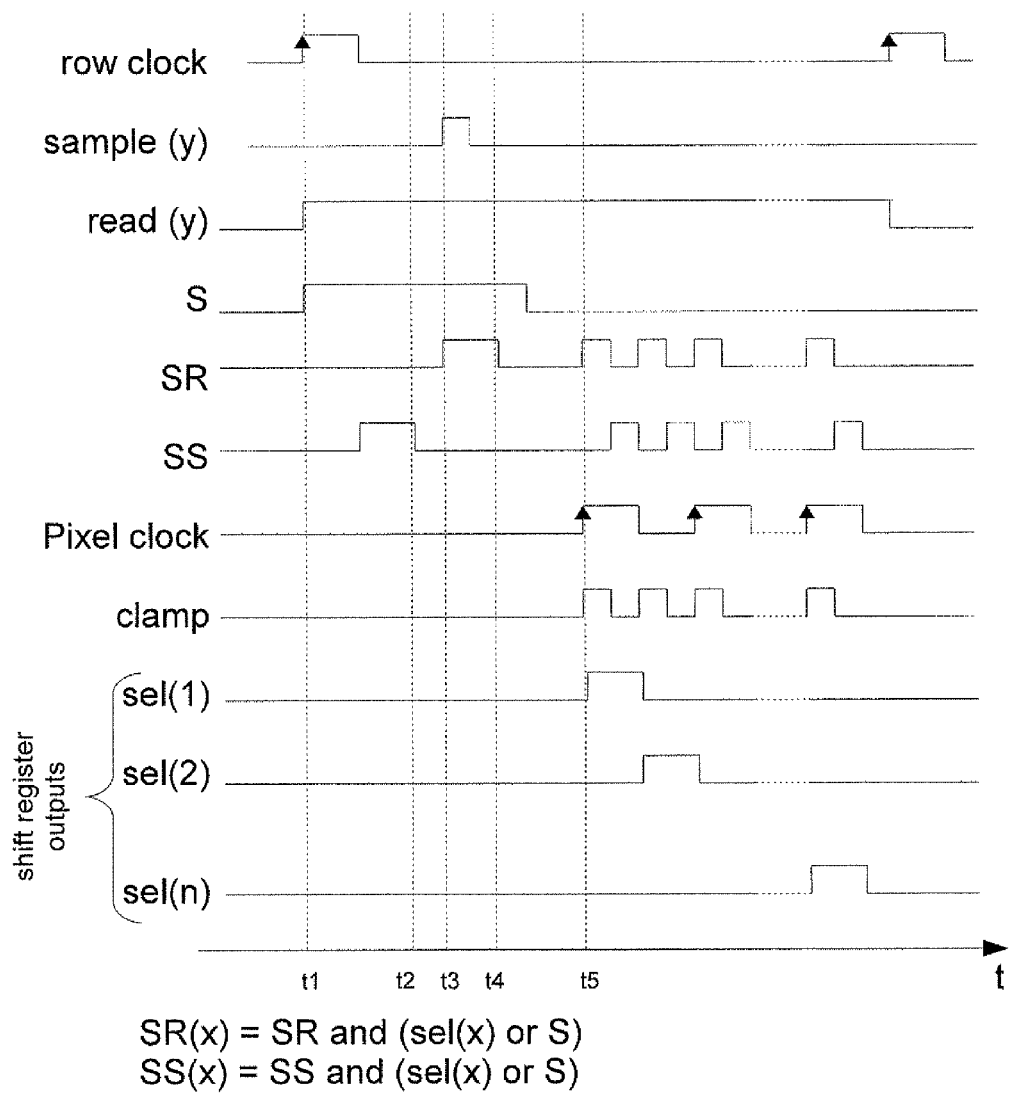
FIG. 8 shows a timing diagram for operation of the pixel array.

FIG. 8 shows a timing diagram for a double sampling operation using the architecture of FIGS. 6 and 7 during readout of the signals stored on the pixel sample capacitors $C_{sample}$. The double sampling operation for readout is as follows:

1. A row of pixels is selected, at t1, by activating the read transistor in the pixels of that row. The signals of the row of pixels appear on the respective column output lines.
2. At t2, the signal of the column line is sampled in column capacitor Cs by closing switches S and SS(x) in each column. Meanwhile, the floating diffusion FD is reset (or kept in the reset state) by closing the reset transistor M1 in the pixel.
3. At t3, the sample switch M3 in each of the selected row of pixels is closed. The capacitor $C_{sample}$ in the pixel samples the reset level. This reset level is buffered by the second buffer amplifier AMP2 in the pixel and appears at the pixel column output line.
4. At t4, the signal of the column output line is sampled on column capacitor CR by closing switches S and SR(x) in each column.
5. At t5 the readout of the signals stored in the column amplifiers starts, by scanning sequentially through the columns, and multiplexing signals from capacitors Cr(x) and Cs(x) of each column on the multiplexer bus for each column (x).
6. The output amplifier calculates the difference between the signals of Cr(x) and Cs(x) for each column (x).

The pixel can also be operated with correlated double sampling (CDS), via another timing scheme:

1. The floating diffusion is reset.
2. The reset level is sampled on sample capacitor $C_{sample}$ through the first buffer amplifier AMP1 and the sample switch M3;
3. The signal of the photodiode 11 is transferred to the floating diffusion FD through transfer gate TO. This ends the exposure time, and starts a new exposure time. The signal remains stored on the floating diffusion FD during the readout.
4. The array is read out. Firstly the reset level stored on the sample capacitor is read out, and then secondly the signal of the floating diffusion FD is sampled on the sample capacitor and read out.

This mode does not allow to reduce the exposure time below the frame readout time. The read noise of the pixel is lower. The kTC noise on the floating diffusion is correlated on the reset and signal samples, and hence cancelled by the correlated double sampling operation in the column and output amplifiers. The drawbacks of this method are an increased parasitic light sensitivity of the storage node (floating diffusion) and leakage current on the floating diffusion storage node that may disturb the stored signal. These disadvantages are not so important at very high frame rates since the time of storage of the signal on the floating diffusion is short.

In each of the embodiments described above, the photodiode is preferably a pinned photodiode as this gives the best performance, but the invention is not limited to pinned photodiode pixels only. Less advantageously, it is possible to use a non-pinned photodiode. This would allow fixed pattern noise correction combined with a pipelined snapshot shutter, and keeps the parasitic light sensitivity low. However, the charge on the photodiode will be divided between the photodiode and the floating diffusion, rather than being (fully) transferred. If the capacitance of the photodiode and floating diffusion are equal, only half of the charge will appear on the floating diffusion. So the signal will have only half the amplitude, or the signal-to-noise ratio will be half as good.

For a triggered global shutter mode of operation, it is possible to use the timing schemes described in FIGS. 8a and 8b but with readout before the next exposure period starts.

Advantageously, low threshold voltage transistors are offered in CMOS technologies for certain functions. If this is the case, a low-voltage transistor can be utilized for reset transistor M1, and source followers M2 and M4 in the pixel of FIG. 4a. With the given timing and bias levels of these transistors, the higher leakage of low-voltage transistors does not influence the performance of circuit. In contrast, the pixel disclosed in U.S. Pat. No. 6,847,070 cannot allow a low threshold voltage device for the reset transistor M1 because of the increased leakage current of low voltage transistors. Since the signal is stored on the floating diffusion in that pixel, which is connected to the source of M1, the leakage current of M1 will disturb the signal sample during storage on the floating diffusion in that pixel. A similar disadvantage exists for U.S. Pat. No. 7,224,389 in which the reset transistor is directly connected to the photodiode and in which leakage on the reset transistor will disturb the signal acquired on this photodiode.

Other timing schemes may also be applied. In the above description, the feedthrough signal of the reset line RESET from the gate of the reset transistor M1 onto the floating diffusion FD is not cancelled in the double sampling process, because the reset line is assumed to be high all the time during readout. This feedthrough can be cancelled, if required, by pulsing the reset line RESET for the row as it is read out. The reset line RESET is pulled low before sampling the reset level on the sample capacitor in the double sampling operation. This is not shown in the timing diagram of FIG. 8. Also, it may be advantageous to perform an extra discharge of the sample capacitor $C_{sample}$ in the pixel during readout, before sampling the reset level. This is also not shown in FIG. 8.

The pixels described above have a storage capacitor $C_{sample}$. In most embodiments, this is used to store a sample of the signal level (i.e. the exposure level of the photodiode) until it can be read by the readout circuitry. This allows pipelined global shutter operation, as the signal level can be stored while the photodiode is exposed to radiation. Double sampling is possible, by reading the signal level held on the storage capacitor followed by reading the reset level of the sense node. The pixel has a noise determined by the kTC noise of the floating diffusion. The temporal noise level is 21 electrons without fixed pattern noise (FPN) correction, and increases to 30 electrons after FPN correction through double sampling (with a 3.7 fF floating diffusion capacitor). This increase is caused by the fact that the kTC noise is uncorrelated on both samples operated during the double sampling process. The fixed pattern noise on an uncorrelated pixel can be up to 100 mV peak-to-peak. With double sampling this is reduced to 1 mV peak-to-peak, or less. Correlated double sampling (CDS) is also possible with the pixel described above by storing the reset level on the storage capacitor and storing the signal level on the sense node. The photodiode can capture the next frame while the reset and signal levels of the previous frame are read out. The only constraint is that the exposure time has to end after the readout of pixel array as the exposure time ends only when the charges are moved from the diode to the floating diffusion.

Figure 9:
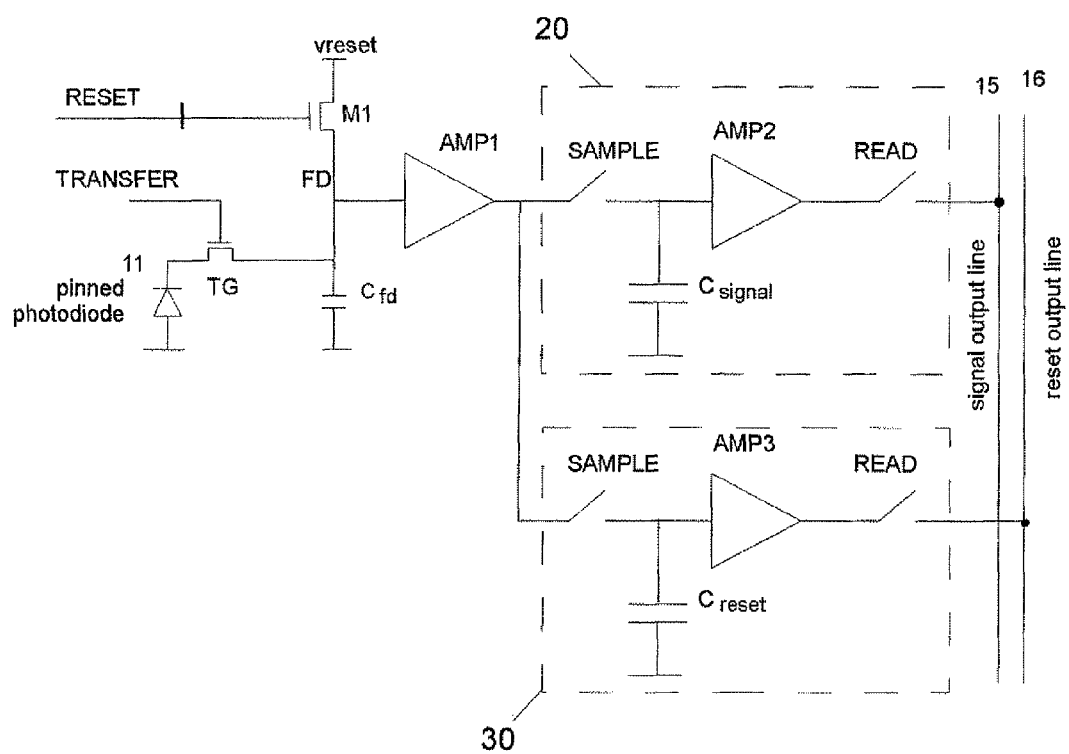
FIG. 9 shows a pixel with two storage stages arranged in parallel.
Figure 10:
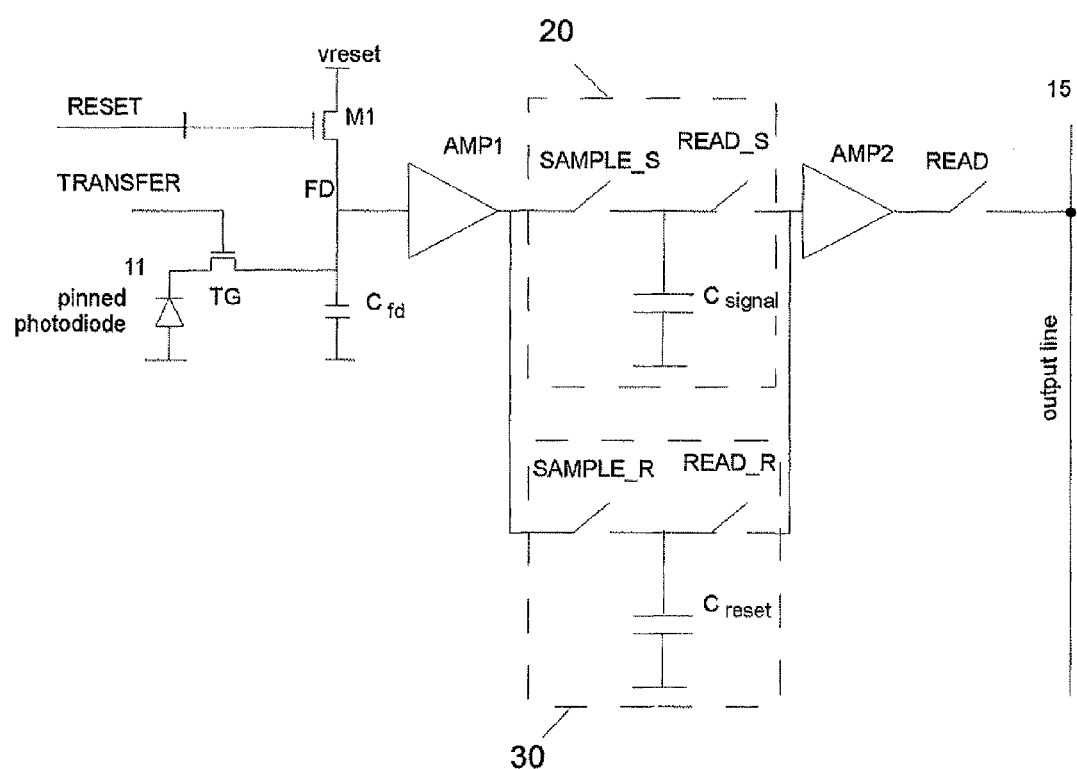
FIG. 10 shows another form of a pixel with two storage stages arranged in parallel and with a single, shared, output buffer amplifier.
Figure 11:
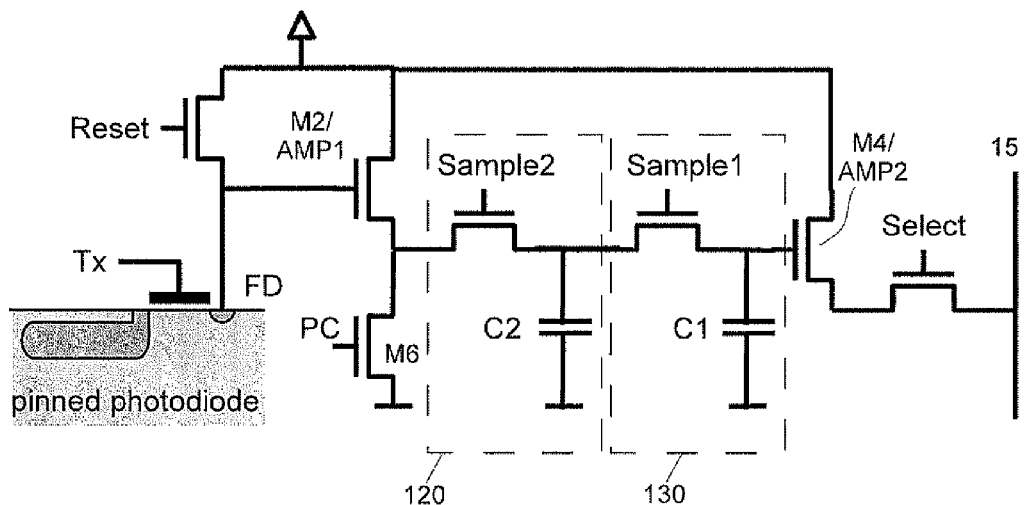
FIGS. 11 and 12 show a pixel with two storage stages arranged in cascade.
Figure 12:
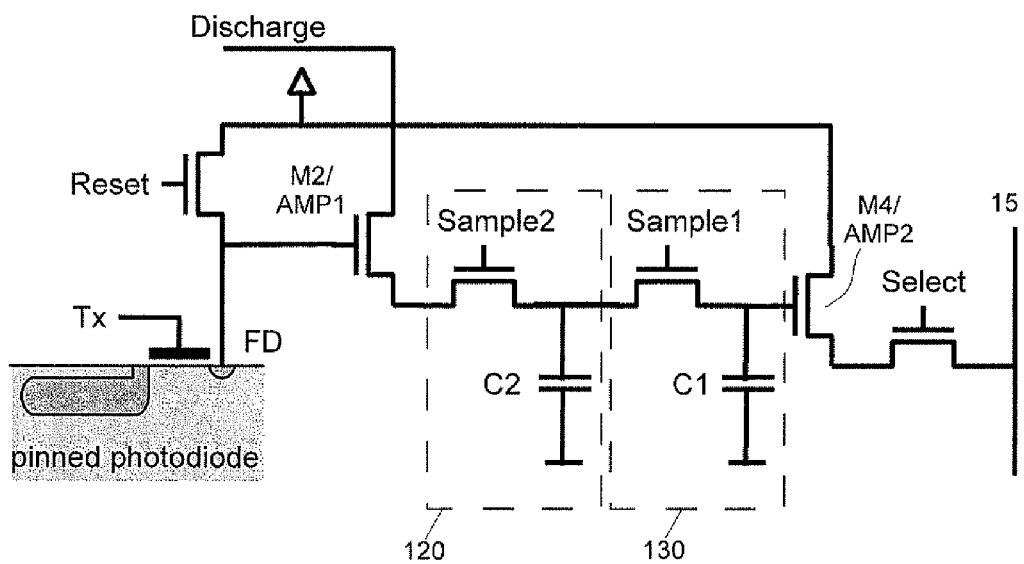

FIGS. 9 to 12 show further embodiments of the pixel in which a second storage stage 30 is added to the pixel. In FIGS. 9 and 10 the second storage stage is arranged in parallel with the first storage stage. In FIGS. 11 and 12 the second storage stage is arranged in cascade with the first storage stage. In FIG. 9 the first storage stage is shown as item 20, and the capacitor is now called $C_{signal}$. Each storage stage 20, 30 is connected to an output of the first buffer amplifier AMP1. Each storage stage 20, 30 has a sample switch/transistor SAMPLE, a storage capacitor $C_{signal}$, $C_{reset}$, and an output buffer amplifier AMP2, AMP3. In this embodiment, each storage stage 20, 30 connects to a dedicated output line 15, 16.

The pixel shown in FIG. 9 can be operated as follows:
1) Charge is integrated on the pinned photodiode during the exposure time.
2) The floating diffusion is reset. The reset level is sampled on capacitor $C_{reset}$.
3) Charge is transferred from the photodiode to the floating diffusion. The signal level at the floating diffusion is sampled, and stored, on capacitor $C_{signal}$. This ends the exposure time.

4) The image is read out by reading the values stored in the pixel capacitors $C_{reset}$ and $C_{signal}$. During readout, the difference between the two signals is calculated. This cancels any kTC noise on the floating diffusion, and it is thus a true correlated double sampling readout. During this readout, the photodiode can be exposed to radiation for the next frame. This pixel can also support other operational modes:
  1. true differential imaging. Two images are acquired shortly after one another. This can be used to analyze very fast events, or for tracking moving objects. A signal value for a first frame is stored in one of the storage stages 20, 30. A signal value for a second frame is stored in the other of the storage stages 20, 30. The difference between the stored signal values of the two frames can be calculated on chip, by processing circuitry located in the column output stages of the array, or by additional circuitry within each pixel.
  2. acquisition of two images with different exposure times, for increased dynamic range. This gives an alternative to multiple slope integration. Operation is as described above, with the added feature that the exposure period of the photodiode is varied between the first frame and the second frame.

Another advantage of this embodiment of the pixel is that the reset level is sampled just before the charge transfer from the photodiode to the floating diffusion. This is at the end of the exposure time. This means that the reset sample stored on the reset capacitor $C_{reset}$ is not influenced by parasitic light during the exposure time. Parasitic light sensitivity is the same for the reset and signal samples, and hence it will be extremely small after the CDS operation. The remaining noise in such differential pixels is the source follower noise, which is mainly a 1/f noise component. Since the time interval between the reset and signal samples is very low in the pinned diode differential pixel the 1/f noise contribution is small. The low-frequency part of the 1/f noise appears as correlated noise. The remaining dominant noise in this pixel is kTC noise on the sample capacitors, which is uncorrelated. The pixel will also feature a much lower fixed pattern noise.

In FIG. 9, each of the two storage stages 20, 30 has an output buffer amplifier AMP2, AMP3. Both stored signals are read out at the same moment in time, simplifying the column differential amplifier and speeding up pixel access. This is a particularly advantageous architecture to obtain a low noise, high-speed, readout.

FIG. 10 shows an alternative form of the pixel in which the two storage stages 20, 30 are read out serially through the same buffer amplifier. Each stage 20, 30 has a switch READ_S, READ_R which can be selectively closed to connect the capacitor in one of the stages 20, 30 to the output buffer amplifier AMP2. This pixel will cancel the offset variations of all transistors in the pixel. This will increase the pixel access time, as a single output line must be used to read both stored values.

Alternatively, the offset variations of amplifiers AMP2 and AMP3 in FIG. 9 can be corrected by reading an extra reference level after discharging $C_{sample}$ and $C_{reset}$, or after bringing the inputs of AMP2 and AMP3 to the same reference level. This reading can occur immediately after the reading of the sampled values on capacitors $C_{sample}$ and $C_{reset}$.

The pixels shown in FIGS. 9 and 10 require additional circuitry per pixel, which will lower the fill factor. However, the difference in fill factor may be entirely compensated by the lower noise of the pixel.

The embodiments shown in FIGS. 9 and 10 retain the other advantages described above, such as anti-blooming protection through the transfer gate and reset transistor, without requiring additional anti-blooming circuitry.

The embodiments shown in FIGS. 9 and 10 can be applied to shared pixels, where two photodiodes share one pair of storage stages 20, 30. Signals from only one of the two photodiodes can be stored in the storage stages 20, 30 to give a sub-sampled image. Alternatively, the signals of the two photodiodes can be added together on the sense node, by operating both transfer gates with the same timing signals, to give a 'binned' image that can be stored with CDS in the 2 memory elements. A further alternative is to store the images of the two different photodiodes in the two storage stages and subtract them on-chip to obtain a kind of 'sobel' filtered image. Only the edges will be visible in that image.

FIGS. 11 and 12 show a pixel with two storage stages 120, 130 arranged in cascade. This has an advantage over the parallel arrangement of sample stages 20, 30 in FIGS. 9 and 10 of requiring fewer components. Also, the parasitic capacitance at the readout node can be problematic in the case where the sample capacitors cannot be made relatively large. These disadvantages are addressed by this cascade arrangement.

Figure 13A:
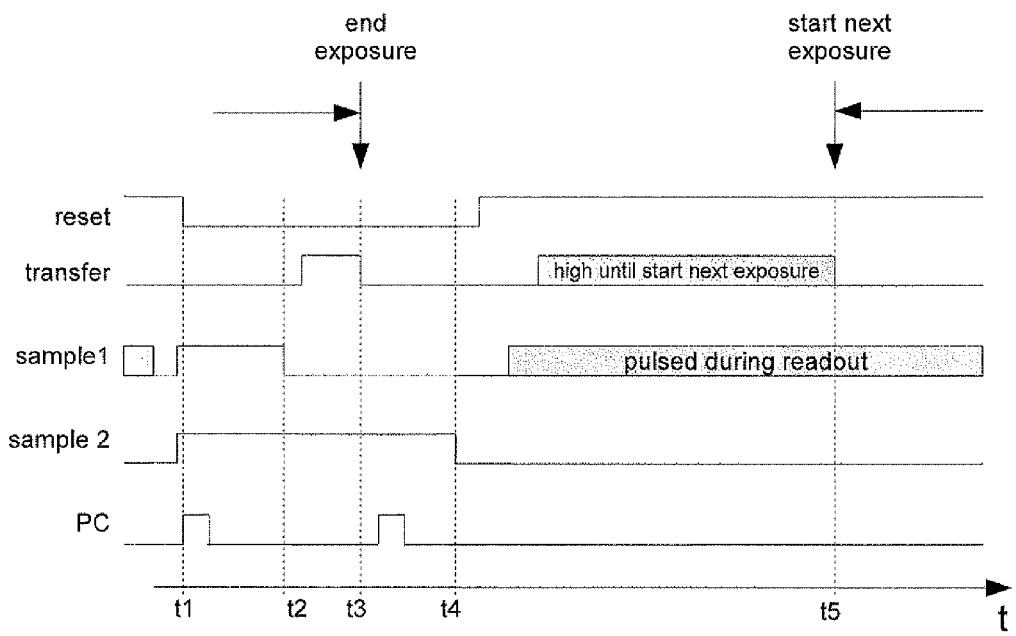
FIGS. 13a and 13b show timing diagrams for operation of the pixels of FIGS. 11 and 12 respectively.
Figure 13B:
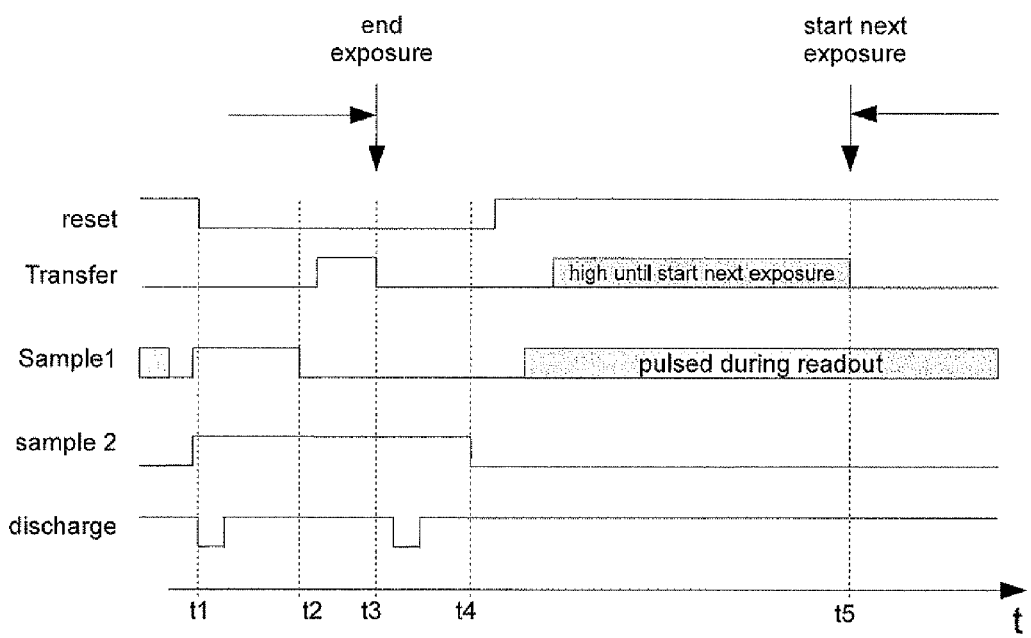
Figure 14:
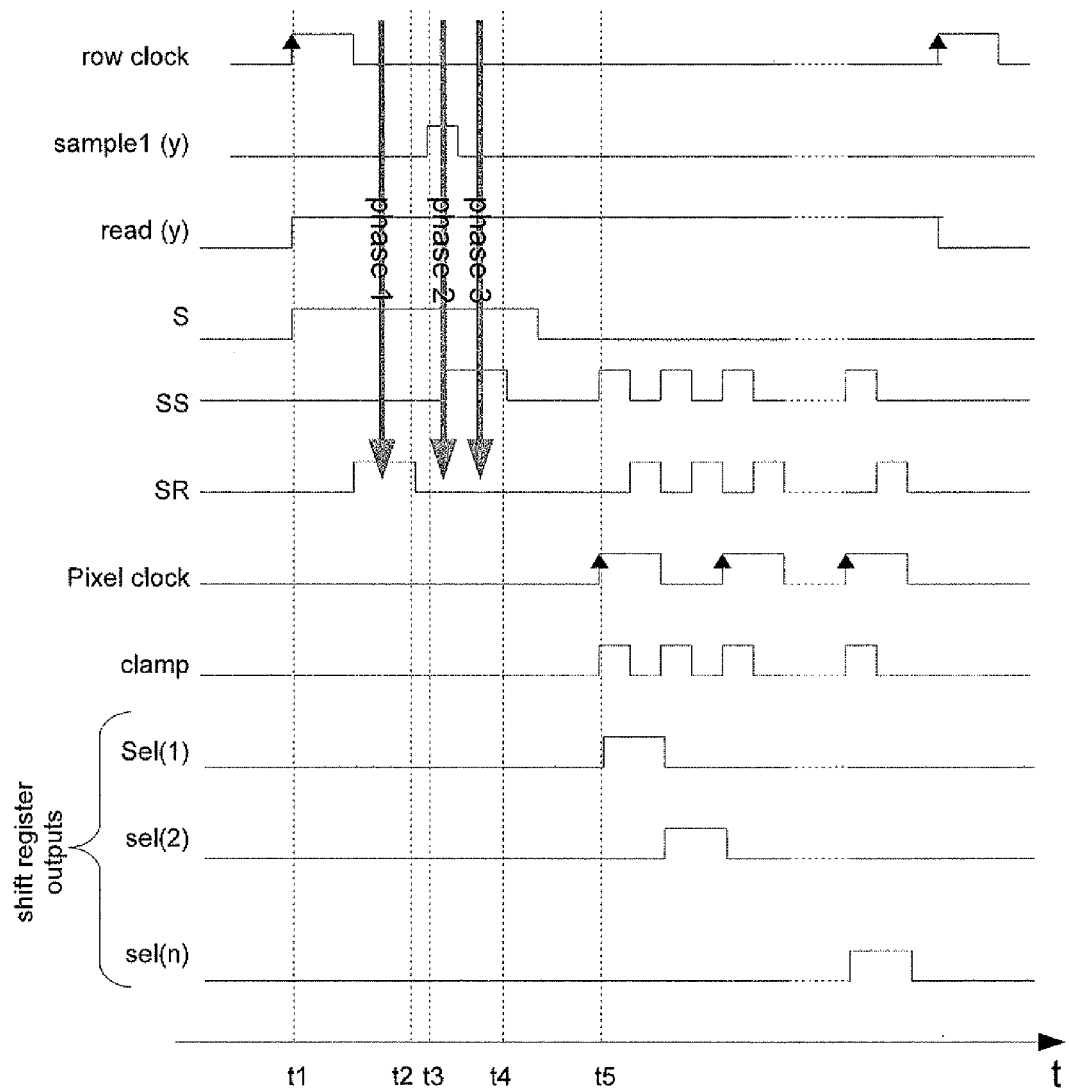
FIG. 14 shows a timing diagram for operation of a pixel array comprising the pixels of FIGS. 11 and 12.

The pixel is operated as follows (see FIGS. 13a and 13b). At the end of the integration period, the sense node FD is reset and the value of the sense node FD (the reset value of the pixel) is sampled on capacitor Cl (through sample 1 and sample 2 switches). In this phase, when sampling the reset value of the FD, both C2 and Cl are charged. This is not a problem, because this happens after readout of all the signals in the array (i.e. during "frame blanking time"). Charges are transferred from the photodiode into the sense node FD by pulsing the transfer line Tx. The signal value is then sampled on capacitor C2 by operating the sample 2 switch. During readout (see FIG. 14), the pixel is selected and the reset signal on capacitor Cl is first readout (phase 1). The sample1 switch is then closed and there will be charge sharing between Cl and C2 (phase 2). The sample1 switch is then again opened (phase 3). Neglecting any attenuation from the source followers, voltage threshold shifts and clock feedthrough, the signal that is readout during phase 1 is:

$$V_{output} = V_{reset} + v_{noise,fd} + v_{noise,C1} \quad (1)$$

where $V_{reset}$ is the reset value of the pixel and $v_{noise,fd}$ and $v_{noise,C1}$ are the kTC noise contributions from $C_{FD}$ and $C_1$ respectively.

During phase 2, when the sample 1 switch is closed, the output voltage is:

$$V_{output} = V_{reset} + v_{noise,fd} + (C_1/(C_1+C_2)) \times v_{noise,C1} + (C_2/(C_1+C_2)) \times v_{noise,C2} - (C_2/(C_1+C_2)) \times V_{signal} \quad (2)$$

with $V_{signal}$ the light induced voltage drop of the pixel and $v_{noise,C2}$ the kTC noise contribution from $C_2$.

During the phase 3 a non-correlated kTC noise contribution $v^*_{noise,C1}$ is added:

$$V_{output} = V_{reset} + v_{noise,fd} + (C_1/(C_1+C_2)) \times v^*_{noise,C1} + (C_2/(C_1+C_2)) \times v_{noise,C2} - (C_2/(C_1+C_2)) \times V_{signal} + v^*_{noise,C1} \quad (3)$$

Subtracting (3) from (1) yields $$V_{signal} = (C_2/(C_1+C_2)) \times V_{signal} + (C_2/(C_1+C_2)) \times (v_{noise,C1} + v_{noise,C2}) + v^*_{noise,C1}$$

Note that the output signal of phase 2 can also be used, but it may exhibit a pixel variant offset from clock feedthrough of sample1. The pixel fixed pattern noise may therefore not be cancelled completely but the temporal read noise will be lower.

The main advantage of this pixel architecture with cascaded sampling compared to single sampling architectures is that it allows true correlated double sampling of the FD in pipelined synchronous shutter operation. It will therefore result in considerably better noise performance. Also, since the shutter efficiency for both samples can be made to be virtually equal, the remaining parasitic light sensitivity will be very small.

FIG. 11 shows a precharge transistor PC connected between the source of the buffer amplifier M2 and ground. The function of transistor PC is to discharge the capacitor C2 before it is recharged by the source follower to its final value. At the moment the reset level is sampled on C1, it also discharges C1 through the two sample switches. It also acts as a current source for the buffer amplifier M2.

In FIG. 12, the precharge transistor of FIG. 11 is omitted and the drain of transistor M2 is connected to a discharge line instead. Transistor M2 now acts both as precharge transistor (when discharge line is pulled low) and as source follower (when discharge line is pulled high). FIGS. 13a and 13b show timing diagrams for the acquisition of an image and storage of the image in the two pixel sample capacitors $C_1$ and $C_2$. FIG. 13a shows the timing for a pixel as in FIG. 11, with a dedicated precharge transistor MG. The PC bias line can be kept continuously high as well, operating the transistor M6 as current source for the source follower. FIG. 13b shows the timing for a pixel as in FIG. 12 in which the capacitors are discharged via the source follower M2.

The various forms of pixel described above can be used to effect a global shutter (pipelined mode or triggered mode) with double sampling, or correlated double sampling. The storage capacitor $C_{signal}$, storage capacitor $C_{reset}$, sense node and photodiode can all serve as memory elements. For a basic pipelined shutter, with no double sampling/CDS, two memory elements are required: one memory element to store the signal value of the previous image and one to store the image that is acquired. For a pipelined shutter with double sampling three memory elements are required: one to store a signal value of the previous image; one to generate/store a reference level during readout without disturbing the photodiode (with uncorrelated noise); and one for the image being acquired. A pipelined shutter with correlated double sampling is also possible with three memory elements, if the signal level is stored on the sense node (not ideal). For a pipelined shutter with correlated double sampling, four memory elements are ideally required: a memory element to store the reference (reset) level of the previous image (with correlated noise); a memory element to store the signal of the previous image and a photodiode to store the image being acquired. The sense node also serves as a kind of a memory element to provide a reference before readout of the diode without destroying the photodiode signal. The advantage compared with the case where a pipelined shutter with correlated double sampling is implemented using only three memory elements, there is no need to store a photodiode signal on the sense node, which is not an ideal storage element.

Various methods of operating the pixels and/or pixel arrays are possible. These are set out below.

A method of operating a pixel, the pixel comprising a photo-sensitive element, a sense node and a transfer gate connected between the photo-sensitive element and the sense node, a first buffer amplifier having an input connected to the sense node, a sample stage connected to an output of the first buffer amplifier and a second buffer amplifier having an input connected to the sample stage, the method comprising: generating charges at a photo-sensitive element in response to incident radiation; resetting the sense node; operating the transfer gate to transfer charge from the photo-sensitive element to the sense node; causing the sample stage to sample a signal on the sense node which represents an exposure level of the pixel; reading the sampled exposure level of the pixel; resetting the sense node; causing the sample stage to sample a signal on the sense node which represents a reset level of the pixel; and, reading the sampled reset level of the pixel.

A method of operating a pixel, the pixel comprising a photo-sensitive element, a sense node and a transfer gate connected between the photo-sensitive element and the sense node, a first buffer amplifier having an input connected to the sense node, a sample stage connected to an output of the first buffer amplifier and a second buffer amplifier having an input connected to the sample stage, the method comprising: generating charges at a photo-sensitive element in response to incident radiation; resetting the sense node; causing the sample stage to sample a signal on the sense node which represents a reset level of the pixel; operating the transfer gate to transfer charge from the photo-sensitive element to the sense node; reading the sampled reset level of the pixel; causing the sample stage to sample a signal on the sense node which represents an exposure level of the pixel; and, reading the sampled exposure level of the pixel.

A method of operating a pixel, the pixel comprising a photo-sensitive element, a sense node and a transfer gate connected between the photo-sensitive element and the sense node, a first buffer amplifier having an input connected to the sense node, a first sample stage connected to an output of the first buffer amplifier and a second sample stage connected to an output of the first buffer amplifier, the method comprising: generating charges at a photo-sensitive element in response to incident radiation; resetting the sense node; causing the first sample stage to sample a signal on the sense node which represents a reset level of the pixel; operating the transfer gate to transfer charge from the photo-sensitive element to the sense node; causing the second sample stage to sample a signal on the sense node which represents an exposure level of the pixel; and, reading the sampled exposure level of the pixel and the sampled reset level of the pixel.

A method of operating a pixel, the pixel comprising a photo-sensitive element, a sense node and a transfer gate connected between the photo-sensitive element and the sense node, a first buffer amplifier having an input connected to the sense node, a first sample stage connected to an output of the first buffer amplifier and a second sample stage connected to an output of the first buffer amplifier, the method comprising: generating charges at a photo-sensitive element in response to incident radiation; resetting the sense node; operating the transfer gate to transfer charge from the photo-sensitive element to the sense node; causing the first sample stage to sample a signal on the sense node which represents a first exposure level of the pixel; generating charges at a photo-sensitive element in response to incident radiation; resetting the sense node; operating the transfer gate to transfer charge from the photo-sensitive element to the sense node; causing the second sample stage to sample a signal on the sense node which represents a second exposure level of the pixel; and, reading the sampled exposure levels of the pixel.

A method of operating a pixel, the pixel comprising a photo-sensitive element, a sense node and a transfer gate connected between the photo-sensitive element and the sense node, a first buffer amplifier having an input connected to the sense node, a first sample stage connected to an output of the first buffer amplifier and a second sample stage connected in cascade with the first sample stage, the method comprising: generating charges at a photo-sensitive element in response to incident radiation; resetting the sense node; causing the second sample stage to sample a signal on the sense node which represents a reset level of the pixel; operating the transfer gate to transfer charge from the photo-sensitive element to the sense node; causing the first sample stage to sample a signal on the sense node which represents an exposure level of the pixel; and, reading the sampled reset level of the pixel and then the sampled exposure level of the pixel.

A method of operating a pixel, the pixel comprising a photo-sensitive element, a sense node and a transfer gate connected between the photo-sensitive element and the sense node, a first buffer amplifier having an input connected to the sense node, a first sample stage connected to an output of the first buffer amplifier and a second sample stage connected in cascade with the first sample stage, the method comprising: generating charges at a photo-sensitive element in response to incident radiation; resetting the sense node; operating the transfer gate to transfer charge from the photo-sensitive element to the sense node; causing the second sample stage to sample a signal on the sense node which represents a first exposure level of the pixel; generating charges at a photo-sensitive element in response to incident radiation; resetting the sense node; operating the transfer gate to transfer charge from the photo-sensitive element to the sense node; causing the first sample stage to sample a signal on the sense node which represents a second exposure level of the pixel; and, reading the sampled first exposure level of the pixel and then the sampled second exposure level of the pixel.

The invention is not limited to the embodiments described herein, which may be modified or varied without departing from the scope of the invention.

The invention claimed is:

1. A pixel array capable of pipelined global shutter operation and including an array of pixels, each of the pixels comprising:
   a photo-sensitive element for generating charges in response to incident radiation;
   a sense node;
   a transfer gate, connected between the photo-sensitive element and the sense node, for controlling transfer of charges to the sense node;
   a reset switch connected to the sense node for resetting the sense node to a predetermined voltage;
   a first buffer amplifier having an input connected to the sense node;
   a first sample stage connected to an output of the first buffer amplifier, which is selectively operable to sample a value of the sense node;
   a second sample stage connected in cascade with the first sample stage which is selectively operable to sample a value of the sense node, wherein an output of said first sample stage is connected to an input of said second sample stage; and,
   a second buffer amplifier having an input connected to the second sample stage,
   said pixel array further comprising:
   control circuitry arranged to cause the array of pixels to be exposed synchronously, and to read a value stored in the sample stage of one of said pixels in the array for a first exposure period while the photo-sensitive element of said one of the pixels is exposed for a second exposure period.

2. A pixel array according to claim 1 wherein the first sample stage comprises:
   a sample switch connected to an output of the first buffer amplifier; and,
   a storage element for storing a signal level sampled by the sample switch.

3. A pixel array according to claim 1 further comprising a discharge switch for resetting the first sample stage.

4. A pixel array according to claim 1 wherein the first buffer amplifier is connected to a first control line which is operable to discharge the first sample stage.

5. A pixel array according to claim 4 wherein the reset switch is also connected to the first control line.

6. A pixel array according to claim 1 further comprising a read switch connected to the output of the second buffer amplifier for reading a signal from the pixel.

7. A pixel array according to claim 4 wherein the first sample stage comprises a first sample switch connected to a first node and a first storage element connected in series with the first sample switch, the second sample stage comprises a second sample switch connected to the output of the first sample stage and a second storage element connected in series with the second sample switch, and wherein both of the input to the second buffer amplifier and the output of the first buffer amplifier are connected to the first node.

8. A pixel array according to claim 1 and control circuitry which is arranged to:
   operate the reset switch to reset the sense node;
   operate the transfer gate of the pixel to transfer charge from the photo-sensitive element to the sense node following exposure to radiation;
   cause the first sample stage of the pixel to sample the signal on the sense node, which sampled signal represents an exposure level of the pixel.

9. A pixel array according to claim 8 wherein the control circuitry is further arranged to:
   read the sampled exposure level of the pixel; and subsequently, to:
   cause the first sample stage to sample the sense node after it has been reset, which sampled signal represents a reset level of the pixel; and,
   read the sampled reset level of the pixel.

10. A pixel array according to claim 8 wherein the control circuitry is arranged to operate the reset switch of the pixel while the photo-sensitive element of the pixel is being exposed to radiation.

11. A pixel array according to claim 10 wherein the control circuitry is arranged to operate the reset switch at all times other than when it is required to transfer charge to the sense node and sample a value of the sense node.

12. A pixel array according to claim 1 and control circuitry which is arranged to:
   cause the second sample stage to sample a reset level of the sense node, by operating the first and second sample stages;
   cause charge to be transferred from the photo-sensitive element to the sense node; and,
   cause the first sample stage to sample a signal level of the sense node.

13. A pixel array according to claim 1 and control circuitry which is arranged to:
   cause transfer of charge of a first exposure from the photo-sensitive element to the sense node;
   cause the second sample stage to sample a signal level of the sense node by operating the first and second sample stages;
   cause transfer of charge of a second exposure from the photo-sensitive element to the sense node;
   cause the first sample stage to sample a signal level of the sense node.

* * * * *